United States Patent [19]
Hogeboom

[11] Patent Number: 5,818,304
[45] Date of Patent: Oct. 6, 1998

[54] PHASE-LOCKED LOOP

[75] Inventor: John Gordon Hogeboom, Nepean, Canada

[73] Assignee: Northern Telecom Limited, Montreal, Canada

[21] Appl. No.: 821,149

[22] Filed: Mar. 20, 1997

[51] Int. Cl.$^6$ .............................. H03B 5/24; H03L 7/06
[52] U.S. Cl. ........................ 331/11; 331/1 A; 327/147; 327/148
[58] Field of Search ...................... 331/11, 1 A, DIG. 2; 327/147, 148, 156, 157

[56] References Cited

U.S. PATENT DOCUMENTS

| 5,072,195 | 12/1991 | Graham et al. | 327/156 |
| 5,334,951 | 8/1994 | Hogeboom | 331/1 A |
| 5,491,439 | 2/1996 | Kelkar et al. | 327/157 |
| 5,566,204 | 10/1996 | Kardontchik et al. | 327/148 |
| 5,610,560 | 3/1997 | Sauer et al. | 311/11 |
| 5,646,968 | 7/1997 | Kovacs et al. | 311/11 |

FOREIGN PATENT DOCUMENTS 1175507 10/1984 Canada .

OTHER PUBLICATIONS

"Charge–Pump Phase–Lock Loops", F.M. Gardner, IEEE Transactions on Communications, vol. COM–28, No. 11, Nov. 1980, pp. 1849–1858.

"Design of PLL–Based Clock Generation Circuits", D–K Jeong et al, IEEE Journal of Solid–State Circuits, vol. SC–22, No. 2, Apr. 1987, pp. 255–261.

"A PLL Clock Generator with 5 to 110 Mhz of Lock Range for Microprocessors", I.A. Young et al, IEEE journal of Solid–State Circuits, vol. 27, No. 11, Nov. 1992, pp. 1599–1606.

*Primary Examiner*—Son T. Dinh
*Attorney, Agent, or Firm*—Angela C. de Wilton

[57] ABSTRACT

A phase-locked loop (PLL) includes a voltage controlled oscillator (VCO), a charge pump, a phase detector and a frequency detector. The phase detector detects the phase difference between an incoming signal and a VCO signal. The frequency difference between the incoming signal and a reference signal is detected by the frequency detector separately from the phase detector. During the process of attaining phase lock, the phase and frequency detectors operate simultaneously. The VCO signal is phase-locked to the incoming signal when it is present. When the incoming signal is absent, the VCO maintains a frequency close to an intended bit rate by frequency locking to a multiple of the reference signal. It, thus, avoids extreme system behavior and greatly assists rapid reliable phase lock when the incoming signal is applied following a period when it is absent. The PLL is analog for simplicity, low power, and the ability to achieve the finest possible phase resolution, while the frequency lock mode is digitally controlled for high parametric insensitivity and ease of disabling to minimize power consumption and jitter once phase lock is attained. The frequency detector includes two counters for counting the VCO and reference signals. The frequency detector inhibits either of the counters as needed to force them both to count at the same rate and uses inhibit pulses to control a separate charge pump connected directly to the integration capacitor of the PLL. The frequency detector can be easily added to a wide range of charge pump PLLs.

11 Claims, 7 Drawing Sheets

PHASE-LOCKED LOOP

TECHNICAL FIELD

The present invention relates to a phase-locked loop for use in clock and data recovery circuits.

BACKGROUND INFORMATION

It is well known to provide a clock recovery circuit using a phase-locked loop (PLL) for producing, from an incoming digital data signal, for example, in a digital transmission system, a clock signal which is used for timing purposes in processing the data signal. Typically, the data signal is a serial binary signal having binary 1s and 0s represented respectively by the presence and absence of a positive voltage, and the clock signal is produced at the bit rate of the data signal.

Canadian Patent No. 1,175,507 granted to G. C. K. Tsang on Oct. 2, 1984 discloses a conventional type of PLL which comprises a voltage controlled oscillator (VCO), a phase detector and a frequency comparator.

A paper by F. M. Gardner entitled "Charge-Pump Phase-Lock Loops", IEEE Transactions on Communications, Vol. COM-28, No. 11, November 1980, p. 1849, a paper by D.-K. Jeong et al entitled "Design of PLL-Based Clock Generation Circuits", IEEE Journal of Solid-State Circuits, Vol. SC-22, No. 2, April 1987, p. 255, and a paper by I. A. Young et al entitled "A PLL Clock Generator with 5 to 110 MHz of Lock Range for Microprocessors", IEEE Journal of Solid-State Circuits, Vol. 27, No. 11, November 1992, p. 1599 describe another type of PLL which comprises a charge pump and a sequential logic phase/frequency detector (PFD). The PFDs do not, however, work when either input signal is of any non-periodic form such as data. In that case, there will be many periods where there is no transition to use for phase comparison, and the average transition frequency for the input will be unpredictable and less than the proper clock frequency. Furthermore, it is often desirable for a PLL to have response characteristics with a large amount of inertia to reduce jitters in the presence of noisy data, but also to have an opposing requirement to find lock relatively quickly.

SUMMARY OF THE INVENTION

It is an object of the present invention to provide an improved phase-locked loop.

According to the most general aspect of the present invention, there is provided a phase-locked loop (PLL) for providing a frequency controlled signal which is phase-locked with an input signal, the PLL comprising: a voltage controlled oscillator (VCO) for generating the frequency controlled signal and first and second VCO signals, in response to a VCO control signal fed thereto, the phase of the first VCO signal relating to the frequency controlled signal, the frequency of the second VCO signal relating to the frequency controlled signal; phase detection means for providing a first detection signal in response to the input signal and the first VCO signal, the first detection signal representing the phase difference between the input signal and the first VCO signal; frequency detection means for providing a second detection signal in response to a frequency reference signal and the second VCO signal, the second detection signal representing the frequency difference between the frequency reference signal and the second VCO signal; and charge pump circuitry for generating first and second charge pump currents in response to the first and second detection signals, respectively, and integrating the first and second charge pump currents to provide the VCO control signal fed to the VCO, so that the frequency of the frequency controlled signal is controlled by the VCO and the frequency controlled signal is phase-locked with the input signal.

In the PLL, the frequency detection means is separate from the phase detection means. The PLL operates in response to the frequency difference between the frequency controlled signal and the frequency reference signal. Accordingly, accurate and flexible frequency acquisition is achieved, regardless of whether the input signal is present or absent. Also, rapid phase acquisition is achieved whenever the frequency of the input signal is close to the frequency of the frequency reference signal.

For example, the phase detection means comprises means for providing a phase lock indication signal when the frequency controlled signal is phase-locked with the input signal. The phase lock indication signal causes the frequency detection means to be disabled. This avoids interference with phase lock when the frequency of the input signal rate is slightly different from that of the frequency reference signal, minimizes power consumption, and provides both accuracy and flexibility in frequency, independent of component tolerances.

In a further example, the frequency detector acts to modulate the VCO control signal by means of a charge pump circuit which is separate from the charge pump circuit used by the phase comparator but which is compatible in current output magnitude. Hence, the frequency comparison function behaves cooperatively with the phase comparison function and requires no substantial changes in other portions of the charge pump PLL, thereby preserving and enhancing its performance and advantages.

BRIEF DESCRIPTION OF THE DRAWINGS

An embodiment of the present invention will now be described by way of example with reference to the accompanying drawings in which.

DETAILED DESCRIPTION

Figure 1:
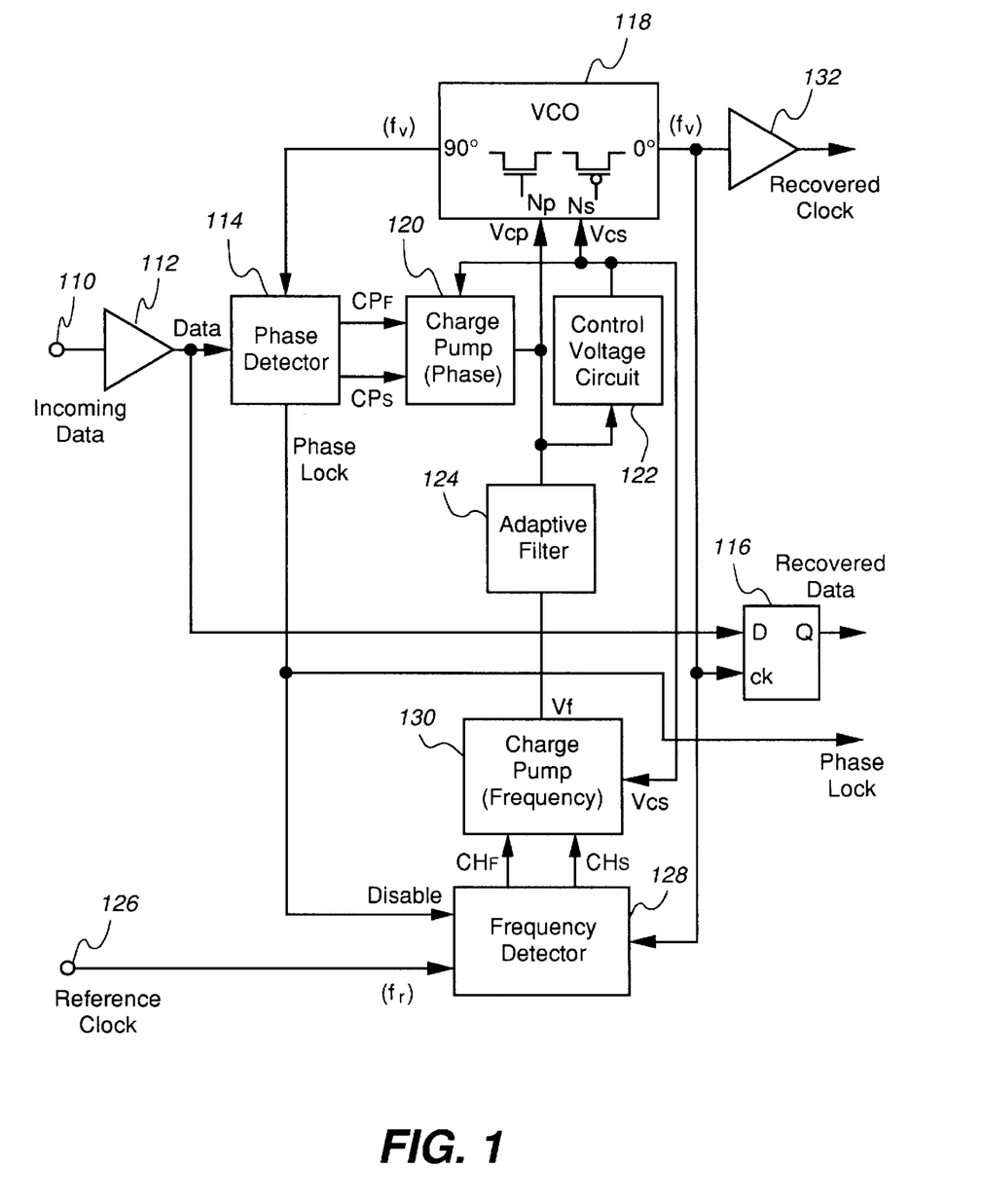
FIG. 1 is a block diagram of a clock recovery circuit using a phase-locked loop according to an embodiment of the present invention.

FIG. 1 shows a clock recovery circuit using a phase-locked loop according to an embodiment of the present invention. An incoming digital data signal includes transitions between upper and lower voltage levels synchronized by a clock signal and is fed to an input terminal 110 of the clock recovery circuit. The terminal 110 is connected to an input terminal of an input buffer 112 which provides a data input signal from its output terminal to a phase detector 114 and a data input terminal D of a D-type flip-flop (FF) 116.

A voltage controlled oscillator (VCO) 118 generates two output signals in different phases (0° and 90°), the frequency $f_v$ of which depends upon primary and secondary control voltages Vcp and Vcs fed to its nodes Np and Ns by a phase control charge pump 120 and a control voltage circuit 122, respectively. A possible circuit implementation of the VCO 118 is a ring oscillator which is, for example, disclosed in FIG. 4 of U.S. Pat. No. 5,334,951 granted to J. G. Hogeboom on Aug. 2, 1994, which is hereby incorporated by reference. The VCO 118 includes N- and P-channel field effect transistors (FETs) as current limiting devices. The FETs are metal oxide semiconductor (MOS) transistors. An example of the charge pump 120 is also shown in FIG. 4 of U.S. Pat. No. 5,334,951 and includes N- and P-channel MOS (NMOS and PMOS) transistors as current limiting devices. The control voltage circuit 122 includes a current mirror circuit and a bootstrap circuit.

The 90° VCO signal is provided from the VCO 118 to the phase detector 114. The phase detector 114 is a logic circuit which provides faster and slower control pulses CPF and CPS to a charge pump 120, in response to the phase difference between the data input signal and the 90° VCO signal. The two control pulses CPF and CPS are produced on the basis of logical combination of the clock signal, the data input signal, and the data input signal delayed by one half of the period of the clock signal. This logic produces faster and slower control pulses CPF and CPS for each data transition which total ½ clock period in duration, the width of the faster control pulse CPF equal to the delay from the data transition to one edge of the 90° VCO signal, and the width of the slower control pulse CPS equal to the delay from this edge to the data transition delayed by ½ clock period. Optimum phase lock occurs when the faster and slower control pulses CPF and CPS are of equal duration or when one edge of the 90° VCO signal is ¼ clock period (90°) delayed relative to the data transition. The charge pump 120 provides current to modulate the primary control voltage Vcp which determines the VCO frequency by directly supplying the gate potential for the current limiting NMOS transistors in the VCO 118 and by driving the control voltage circuit 122. The circuit 122 supplies an equivalent gate potential for the current limiting PMOS transistors in the VCO 118 and also insures that there is always a minimum operating potential applied to the primary control voltage Vcp. In accordance with U.S. Pat. No. 5,334,951, the primary and secondary control voltage Vcp and Vcs are supplied to the charge pump, so that its output will be varied and regulated in proportion to the operating frequency. The PLL of FIG. 1 includes an adaptive filter 124 and the secondary control voltage Vcs is provided by a combination of the filter 124 and the control voltage circuit 122. The voltage Vcs is also fed to the VCO 118.

A reference clock signal (e.g., a frequency $f_r$ of 10 MHz) is fed by a reference clock source (not shown) to a reference clock terminal 126 which is connected to a frequency detector 128. The frequency detector 128 generates faster and slower count charge pulses CHF and CHS in response to the 0° VCO signal and the reference clock signal, under the non-phase-locked condition. When optimum phase lock occurs, the phase detector 114 provides a phase lock indication signal which disables the frequency detector 128. In response to the faster and slower count charge pulses CHF and CHS, a frequency control charge pump 130 provides current to influence output voltage Vf which couples to the primary control voltage Vcp via the filter 124. The current from the charge pump 130 is also varied and regulated in proportion to the operating frequency by the voltages Vf and Vcs with the same benefits as that of the phase control charge pump described in U.S. Pat. No. 5,334,951. The 0° VCO signal is fed from the VCO 118 to an output buffer 132. In the embodiment, the phase control charge pump 120, the control voltage circuit 122, the adaptive filter 124 and the frequency control charge pump 130 constitute charge pump circuitry.

Figure 2:
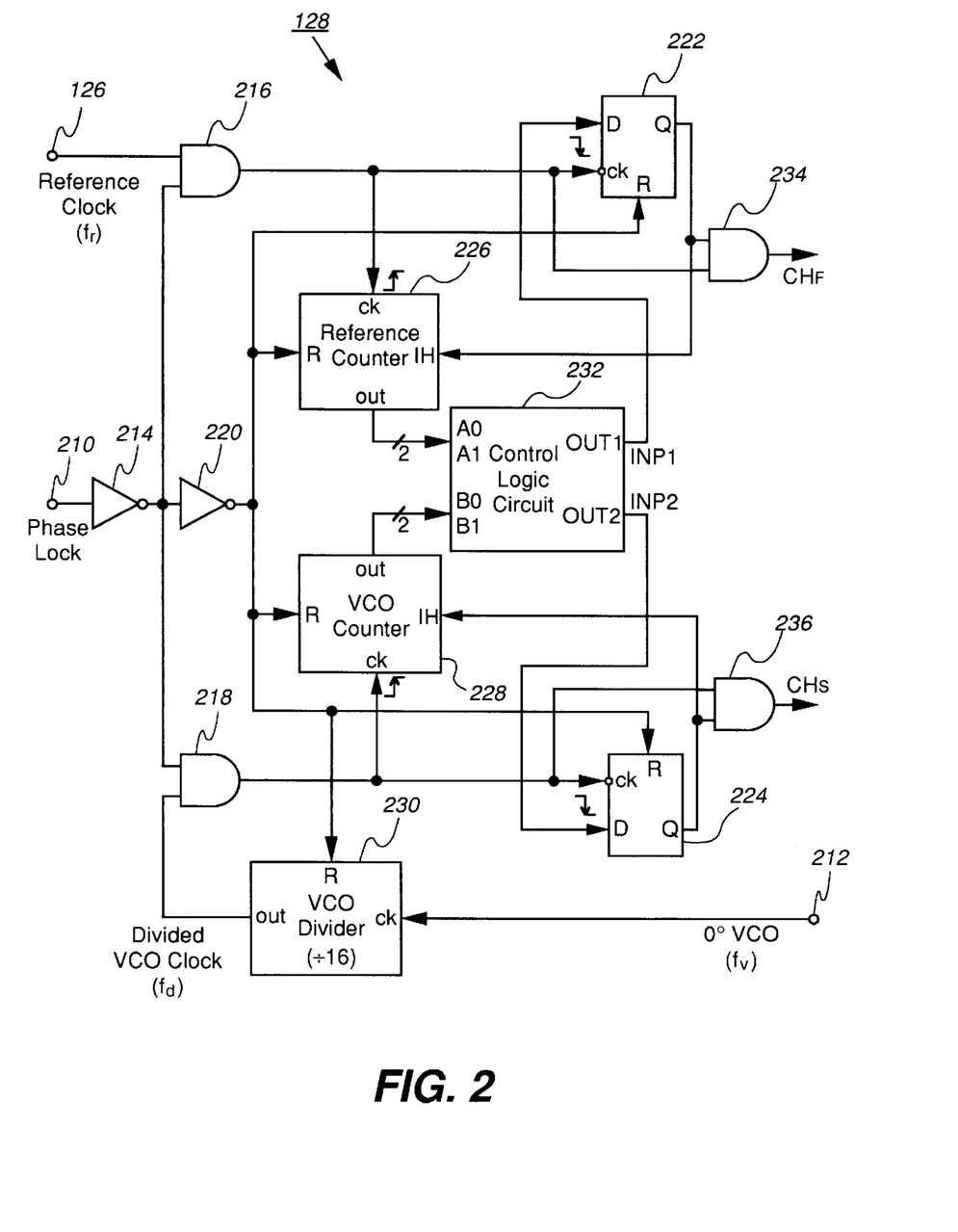
FIG. 2 is a block diagram of a frequency detector shown in FIG. 1.

FIG. 2 shows the frequency detector 128 shown in FIG. 1. Referring to FIG. 2, a phase lock input terminal 210 and a clock input terminal 212 of the frequency detector 128 are connected to the phase detector 114 and the VCO 118, respectively, shown in FIG. 1. The phase lock input terminal 210 is connected to an input terminal of an inverter 214, the output terminal of which is connected to input terminals of two AND gates 216 and 218 and an inverter 220. The output terminal of the inverter 220 is connected to reset terminals R of FFs 222, 224, a reference counter 226, a VCO counter 228 and a VCO divider 230. Each of the reference counter 226 and the VCO counter 228 includes a binary counter. The reference clock terminal 126 is connected to another input terminal of the AND gate 216, the output terminal of which is connected to the clock terminals ck of the FF 222 and the reference counter 226. The clock input terminal 212 is connected to the clock terminal ck of the VCO divider 230, which divides, for example, by 16, to reduce the frequency fv of the VCO signal to substantially that of the reference clock. The output terminal of the VCO divider 230 is connected to another input terminal of the AND gate 218, the output terminal of which is connected to the clock terminals ck of the FF 224 and the VCO counter 228.

The output terminals of the reference counter 226 and the VCO counter 228 are connected to first and second input terminals of a control logic circuit 232, respectively. First and second output terminals OUT1 and OUT2 of the control logic circuit 232 are connected to the D input terminals of the FFs 222 and 224, respectively. The output terminals of the FFs 222 and 224 are connected to inhibit terminals IH of the reference counter 226 and the VCO counter 228, respectively. The Q output terminal of the FF 222 and the output terminal of the AND gate 216 are connected to an AND gate 234. The Q output terminal of the FF 224 and the output terminal of the AND gate 218 are connected to an AND gate 236.

Figure 3:
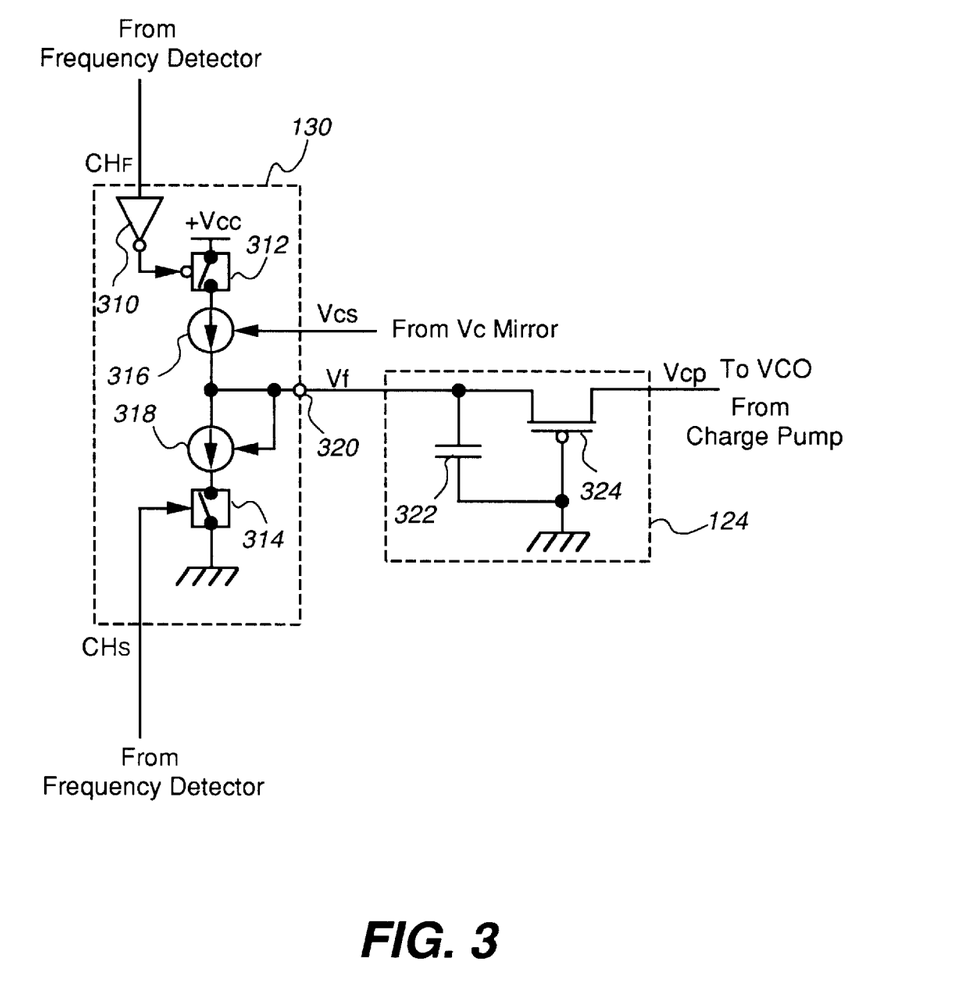
FIG. 3 is a circuit diagram of a charge pump and a filter shown in FIG. 1.

FIG. 3 shows detailed circuits of the charge pump 130 and the filter 124 of FIG. 1. Referring to FIG. 3, the charge pump 130 has an inverter 310, two switches 312 and 314 and two current limiters 316 and 318. The current limiters 316 and 318 are complementary PMOS and NMOS transistors. The switches 312 and 314 are also PMOS and NMOS transistors, respectively. The switch 312 is connected in series with the current limiter 316 between the supply voltage terminal of +Vcc and an output terminal 320 at which the voltage Vf is present. The current limiter 318 is connected in series with the switch 314 between the output terminal 320 and the ground terminal. The current limiters 316 and 318 are controlled by the voltages Vcs and Vf, respectively, to provide substantially equal current limits which vary with the operating frequency of the VCO 118. The faster count charge pulse CHF is fed from the frequency detector 128 to the input terminal of the inverter 310 and the inverted pulse is fed to the gate control terminal of the switch 312. The slower count charge pulse CHS is fed from the frequency detector 128 to the gate control terminal of the switch 318.

The filter 124 includes an integration capacitor 322 and a P-channel FET 324 (MOS transistor). The output terminal 320 of the charge pump 130 is connected to the source of the FET 324 of the filter 124, the gate of which is connected to the ground terminal. The capacitor 322 is connected between the source and gate of the FET 324. The drain of the FET 324 is connected to node Np of the VCO 118. The FET 324 is biased by the two voltages Vf and Vcp, which are of very nearly the same value, causing it to act as an adaptive resistor. The resistance varies in proportion to the VCO output signal period and inversely with the frequency. The capacitor 322 prevents the voltage Vf from making rapid variations. The variable resistance of the FET 324 keeps the voltages Vcp and Vf at close to the same potential while allowing current from the charge pump 120 to cause rapid, limited amplitude, variations in the primary control voltage Vcp to enable rapid limited range phase control. Hence, the voltage Vf controls the average VCO operating frequency while the primary control voltage Vcp is the sum of the voltage Vf and small rapid voltage variations which control the VCO, so that it continuously tracks the phase of the data input signal.

Figure 4:
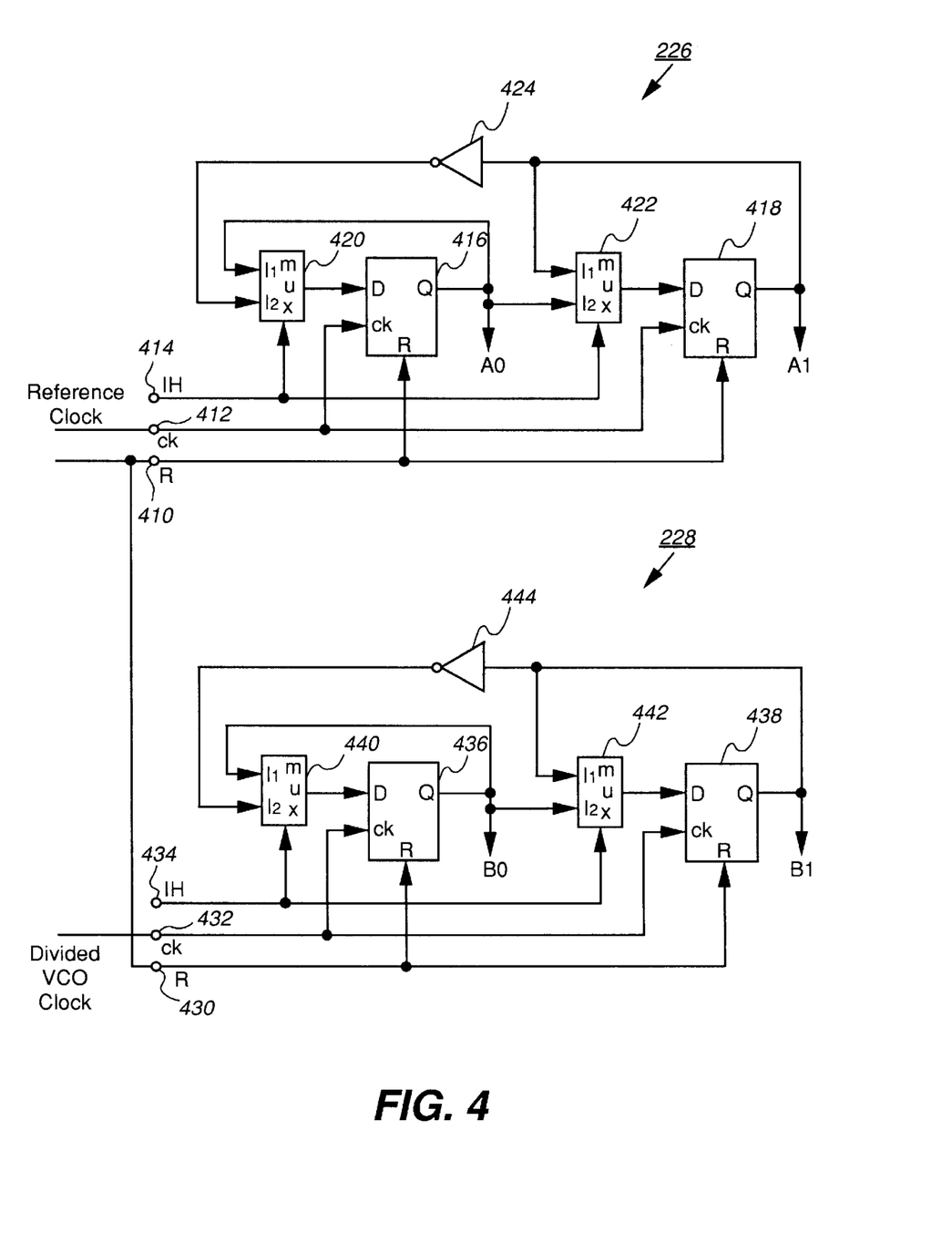
FIG. 4 is a block diagram of reference and VCO counters shown in FIG. 2.

FIG. 4 is a detailed block diagram of the reference counter 226 and the VCO counter 228 shown in FIG. 2. Referring to FIG. 4, a reset terminal (R) 410, a clock terminal (ck) 412 and an inhibit terminal (IH) 414 of the reference counter 226 are connected to the inverter 220, the AND gate 216 and the FF 222, respectively, shown in FIG. 2. The reset terminal 410 is connected to reset terminals R of FFs 416 and 418. The clock terminal 412 is connected to clock terminals ck of the FFs 416 and 418. The inhibit terminal 414 is connected to selection terminals of multiplexers 420 and 422. The Q output terminal of the FF 416 is connected to an input terminal I1 of the multiplexer 420 and an input terminal I2 of the multiplexer 422. The Q output terminal of the FF 418 is connected to an input terminal I1 of the multiplexer 422 and an input terminal of an inverter 424. The output terminal of the multiplexer 422 is connected to the data input terminal D of the FF 418. The output terminal of the inverter 424 is connected to an input terminal I2 of the multiplexer 420. The output terminal of the multiplexer 420 is connected to the data input terminal D of the FF 416. The reference counter 226 provides two bit count outputs A0 and A1 from the Q output terminals of the FFs 416 and 418. The count outputs A0, A1 are fed to the control logic circuit 232.

A reset terminal (R) 430, a clock terminal (ck) 432 and an inhibit terminal (IH) 434 of the VCO counter 228 are connected to the inverter 220, the AND gate 218 and the FF 224, respectively, shown in FIG. 2. The reset terminal 430 is connected to reset terminals R of FFs 436 and 438. The clock terminal 432 is connected to clock terminals ck of the FFs 436 and 438. The inhibit terminal 434 is connected to selection terminals of multiplexers 440 and 442. The Q output terminal of the FF 436 is connected to an input terminal I1 of the multiplexer 440 and an input terminal I2 of the multiplexer 442. The Q output terminal of the FF 438 is connected to an input terminal I1 of the multiplexer 442 and an input terminal of an inverter 444. The output terminal of the multiplexer 442 is connected to the data input terminal D of the FF 438. The output terminal of the inverter 444 is connected to an input terminal I2 of the multiplexer 440. The output terminal of the multiplexer 440 is connected to the data input terminal D of the FF 436. The VCO counter 228 provides two bit count outputs B0 and B1 from the Q output terminals of the FFs 436 and 438. The count outputs B0, B1 are fed to the control logic circuit 232.

Figure 5:
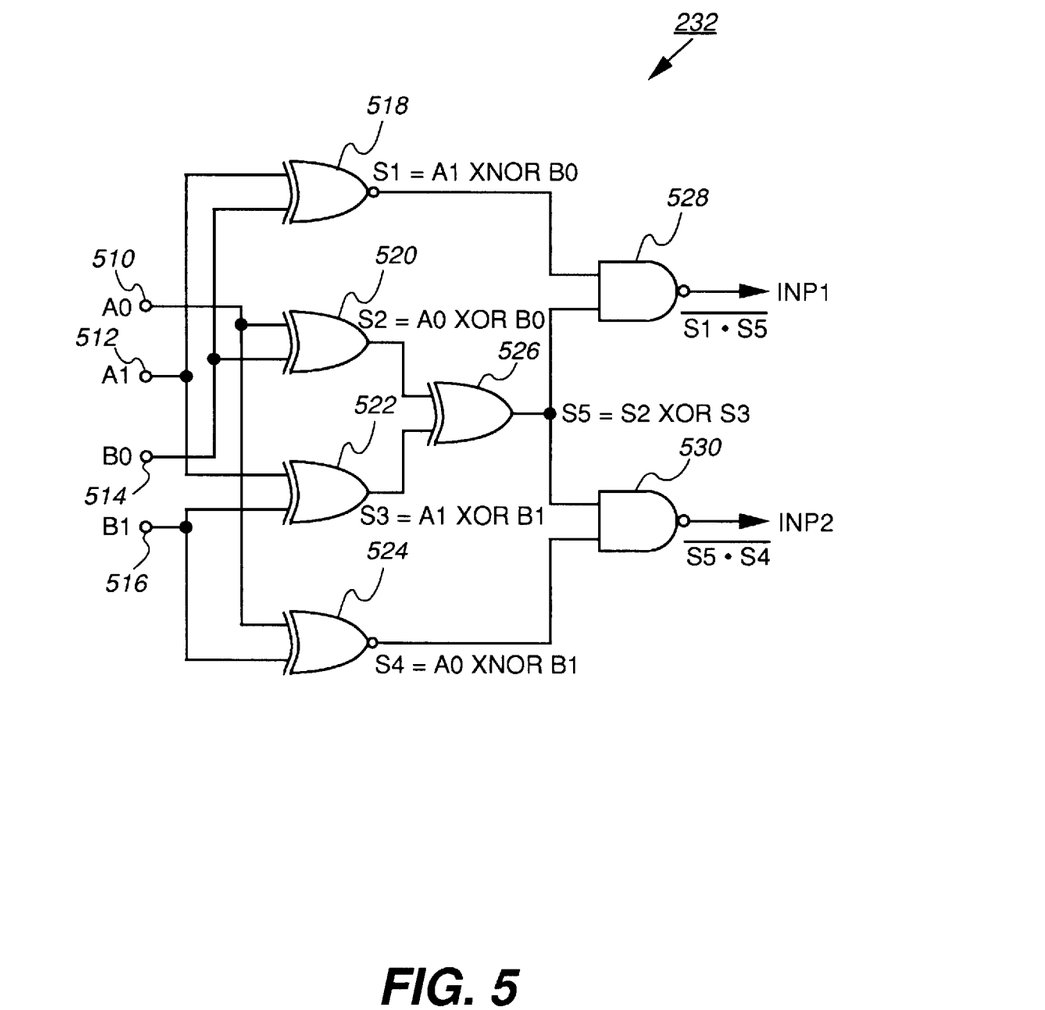
FIG. 5 is a block diagram of a control logic circuit shown in FIG. 2.

FIG. 5 shows the control logic circuit 232 of FIG. 2. Referring to FIG. 5, the control logic circuit 232 has three exclusive OR (XOR) gates 520, 522, and 526, two exclusive NOR (XNOR) gates 518 and 524, and two NAND gates 528 and 530, each having two input terminals and one output terminal. Input terminals 510, 512, 514 and 516 of the control logic circuit 232 are connected to the Q output terminals of the FFs 416, 418, FFs 436 and 438, respectively, shown in FIG. 4. The input terminal 510 is connected to one input terminal of the XOR gate 520 and to one input terminal of the XNOR gate 524. The input terminal 512 is connected to one input terminal of the XNOR gate 518 and to one input terminal of the XOR gate 522. The input terminal 514 is connected to the other input terminals of the XNOR gate 518 and the XOR gate 520. The input terminal 516 is connected to the other input terminals of the XOR gate 522 and the XNOR gate 524. The output terminals of the XOR gates 520 and 522 are connected to the input terminals of the XOR gate 526, the output terminal of which is connected to one input terminal of each of the NAND gates 528 and 530. The output terminals of the XNOR gate 518 and the XOR gate 524 are connected to the other input terminals of the NAND gates 528 and 530. The output terminals of the NAND gates 528 and 530 are connected to the D input terminals of the FFs 222 and 224, respectively, shown in FIG. 2. The control logic circuit 232 generates the inhibit pulses INP1 and INP2 by logical combination of the outputs A0, A1 and B0, B1 from the reference counter 226 and the VCO counter 228.

Figure 6:
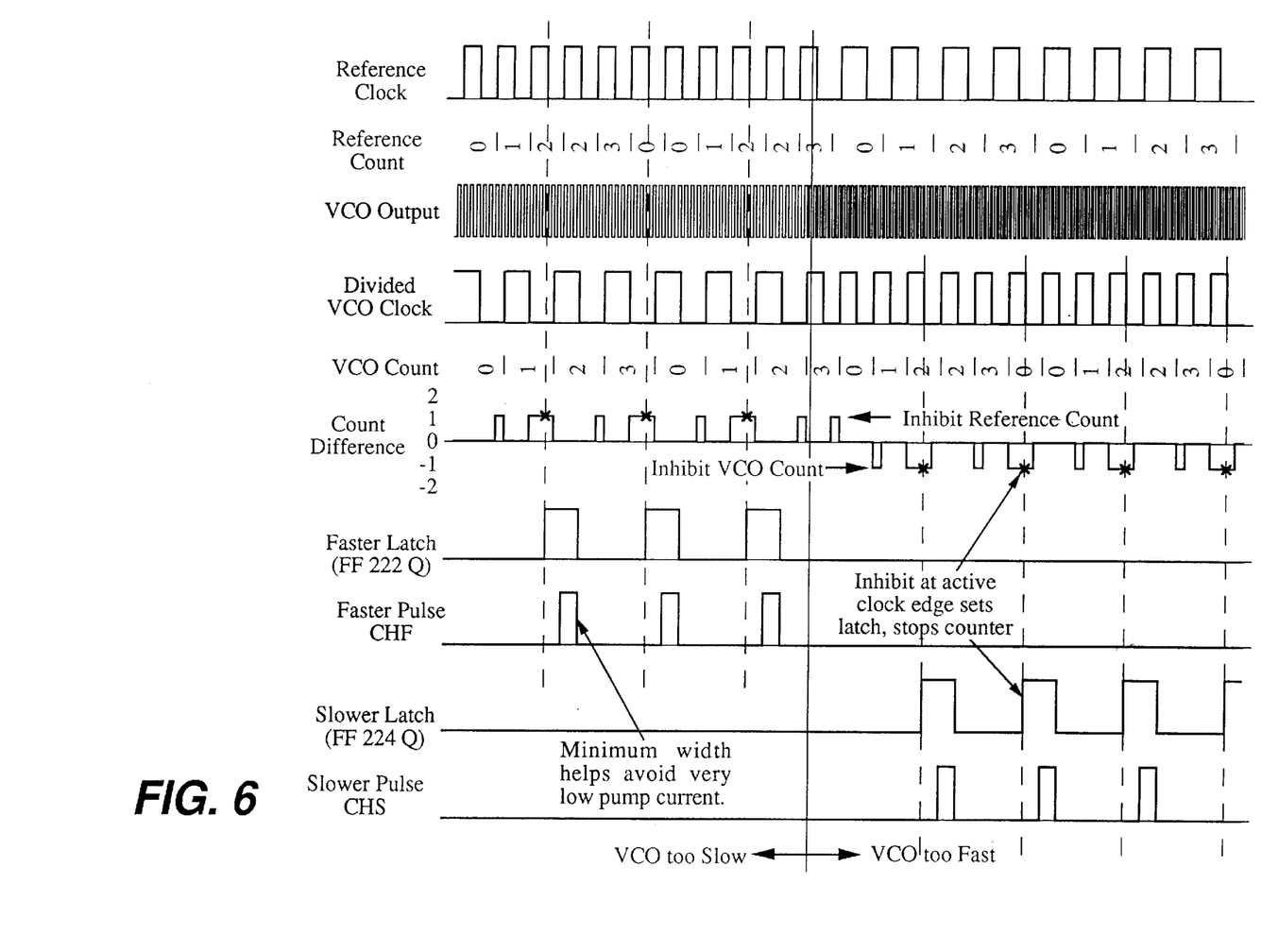
FIG. 6 is a timing chart representing the operation of the frequency detector shown in FIG. 2.
Figure 7A:
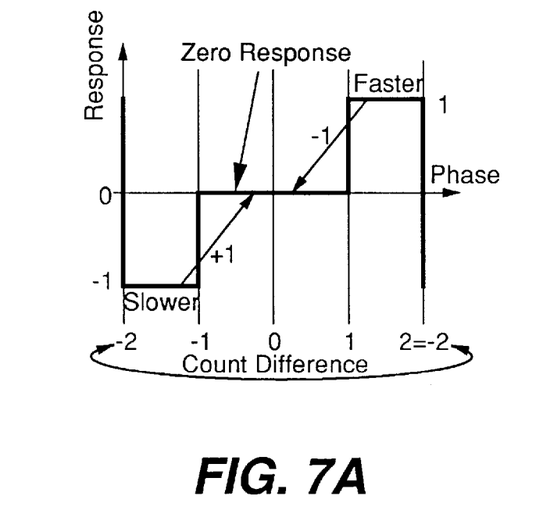
FIG. 7A illustrates detector phase characteristics.
Figure 7B:
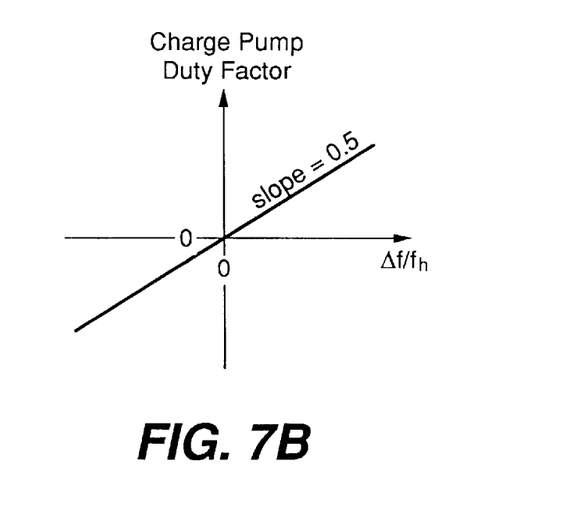
FIG. 7B illustrates detector frequency characteristics.

FIG. 6 is a timing chart representing the operation of the frequency detector 128. FIGS. 7A and 7B illustrate detector phase characteristics and detector frequency characteristics, respectively.

Referring to the drawings, the secondary control voltage Vcs is fed to the gates of the current limiting PMOS transistors of the phase charge pump 120 and the VCO 118. The primary control voltage Vcp is fed to the gates of the complementary current limiting NMOS transistors of the charge pump 120 and the VCO 118. The secondary control voltage Vcs is also fed to the frequency charge pump 130. The control voltage circuit 122 maintains the value of the secondary control voltage Vcs such that the current limits provided by the PMOS transistors will substantially match the current limits provided by the NMOS transistors. Also, the control voltage circuit 122 insures that there is a minimum voltage present at node Np, so that the charge pumps 120 and 130 will provide minimum operating pump current and so that the VCO 118 will operate at a minimum frequency. Details of typical VCO and control voltage circuits may be found in U.S. Pat. No. 5,334,951.

The phase detector 114 acts on the data input signal to produce a pulse having a duration of ½ the period of the VCO output clock signals for each data transition, and combines this pulse with the 90° VCO signal to generate the faster and slower control pulses CPF and CPS. The faster control pulse CPF is generated whenever the data transition pulse is present and the 90° VCO signal is at the upper logic voltage level. The slower control pulse CPS is generated whenever the data transition pulse is present and the 90° VCO signal is at the lower logic voltage level. The pulses CPF and CPS activate the charge pump 120 to produce current into node Np and produce zero net current when both are of equal duration. Hence, for each data transition, a charge is produced in proportion to the time difference between the data transition and the falling edge of the 0° VCO signal. This charge is applied to node Np in order to control the primary control voltage Vcp and thereby to control the frequency and phase of the VCO output.

The filter 124 couples the primary control voltage Vcp to control the voltage Vf and thereby passes the current from the charge pump 120 into the capacitor 322 of the filter 124, which over a period of time charges to cause the voltage Vf to reach the average value of the primary control voltage Vcp. The adaptive resistance provided by the FET 324 also causes the primary control voltage Vcp to respond to the charge pulses from the charge pump 120 by producing a small voltage variation with respect to the voltage Vf. The variation has an area in units of voltage-time which is proportional to the charge transferred and also proportional to the resistance of the FET 324 which is in turn proportional to the period of the VCO output. The voltage variation acts by means of the VCO frequency/voltage characteristic to move the phase of the falling edge of the 0° VCO signal closer to the phase of the data transitions by a fixed proportion of the detected phase error. The fixed proportion is termed the "First Order Gain". Hence, the voltage Vf is the voltage required by the VCO 118 to produce the average or center frequency, while the voltage Vcp is the voltage Vf plus small modulations required to keep the phase of the VCO output in alignment with the data input signal, despite variations in the phase of the data input signal and variations in factors, such as supply voltage, which may try to change the VCO frequency.

The phase detector 114 also detects the phase lock condition between the VCO output signal and the data input signal, by detecting when a large number of data transition pulses have all remained sufficiently fixed in phase that none has occurred during the rising edge of the 90° VCO signal. A signal indicating the phase lock condition so generated is fed to the disable input of the frequency detector 128 which is of no use once the phase lock condition has been established.

The 0° VCO signal is fed from the VCO 118 to the output buffer 132 which provides a recovered clock signal from its output terminal. Also, the 0° VCO signal is fed to the clock terminal ck of the FF 116, to the D input terminal of which the data input signal is fed from the buffer 112. Once phase lock has been established, the rising edge of the 0° VCO signal is positioned close to midway between the data transitions. The FF 116 samples the data input signal at the center of each data bit to provide recovered data from its Q output terminal.

When the phase lock condition is not in effect, causing the phase lock condition signal from the phase detector 114 to be "low", the output signals of the inverters 214 and 220 are "high" and "low", respectively. Then, the VCO divider 230, the reference counter 226 and the VCO counter 228 are all enabled by the "low" at their respective reset inputs. At the same time, the reference clock signal fed at the reference clock terminal 126 is forwarded through the AND gate 216 to the clock terminals ck of the reference counter 226 and the FF 222. The 0° VCO signal is divided by the VCO divider 230, for example by a factor of 16. The divided VCO signal of frequency $f_d$ (e.g., approximately 10 MHz) is forwarded through the AND gate 218 to the clock terminals ck of the VCO counter 228 and the FF 224. Hence, as soon as the frequency detector 128 is enabled by the phase lock signal becoming "low", the reference counter 226 and the VCO counter 228 begin to count upward from their lowest state. If one counts at a different rate from the other, then the faster counter will begin to overtake the other slower counter. When the reference counter 226 moves more than 1 full count ahead of the VCO counter 228, the control logic circuit 232 will detect this condition and will produce at its output terminal OUT1 an inhibit pulse INP1, which is latched by the FF 222 on the falling edge of the clock signal from AND gate 216. One half clock period later the latched inhibit signal from the Q output terminal of the FF 222 will inhibit the positive edge triggered reference counter 226 from advancing and will cause the AND gate 234 to produce the faster count charge pulse CHF with the same duration as the "high" phase of the reference clock signal fed at the terminal 126. When the VCO counter 228 moves more than 1 full count ahead of the reference counter 226, the control logic circuit 232 will detect this condition and will produce at its output terminal OUT2 an inhibit pulse INP2 which is latched by the FF 224 on the falling edge of the divided VCO clock signal. One half clock period later the latched inhibit signal from the Q output terminal of the FF 224 will inhibit the positive edge triggered VCO counter 228 from advancing and will cause the AND gate 236 to produce the slower count charge pulse CHS with the same duration as the "high" phase of the divided VCO clock.

FIG. 6 shows this behaviour by means of a sequence of 10 key signals, first with the reference clock operating at a frequency 50% greater than the divided VCO clock, which results in the reference counter 226 being inhibited from counting and a faster pulse CHF being generated on every third reference clock pulse, then with the divided VCO clock operating at a frequency 50% greater than the reference clock, which results in the VCO counter 228 being inhibited from counting and a slower pulse CHS being generated on every third divided VCO clock pulse. This behaviour is represented by a clock phase diagram in FIG. 7A where the relative clock phase is depicted in units of clock cycles or count difference, while the counter inhibit and charge pump pulses are depicted by the +1 and −1 arrows. The result is the average count rate of the faster counter being slowed down to match that of the slower counter and the frequency of the charge pump pulses is equal to the frequency difference Δf between the reference clock (fr) and the divided VCO clock (fd). The duty factor of these pulses, hence the average relative output current from the charge pump 130, is equal to one half of the frequency difference Δf divided by the greater fh of the two frequencies as indicated in FIG. 7B.

When the VCO frequency is less than desired (i.e., less than the reference frequency times the divider ratio), inhibit pulses INP1 are generated to prevent the reference counter 226 from advancing at a faster average rate than that of the VCO counter 228, the frequency of these inhibit pulses thereby being the frequency difference Δf between the reference frequency and the divided VCO frequency. For each inhibit pulse, a faster count charge pulse CHF is generated, producing an average charge pump output current to the capacitor 322 of the filter 124 which is positive and also proportional to the frequency difference Δf. This charges the capacitor 322 and increases the VCO frequency in a decaying exponential manner toward the desired operating frequency.

When the VCO frequency is greater than desired (i.e., greater than the reference frequency times the divider ratio), inhibit pulses INP2 are generated to prevent the VCO counter 228 from advancing at a faster average rate than that of the reference counter 226, the frequency of these inhibit pulses thereby being the frequency difference Δf between the divided VCO frequency and the reference frequency. For each inhibit pulse, a slower count charge pulse CHS is generated, producing an average charge pump output current to the capacitor 322 which is negative and also proportional to the frequency difference Δf. This discharges the capacitor 322 and reduces the VCO frequency in a decaying exponential manner toward the desired operating frequency.

When the phase detector 114 does not indicate that the phase-locked condition has been firmly established, either because of an improper or poor quality incoming digital data signal, or because there has been insufficient time to make the determination, it is beneficial for the phase and frequency detectors to work cooperatively to control the VCO frequency and phase because the average frequency must not be allowed to drift substantially, while an opportunity must be provided to lock to the phase of the data input signal. To do this, the phase detector 114 must not cause the divided VCO frequency to be pulled very far from the reference frequency, even with improper data, and the frequency detector 128 must not prevent phase lock even if the divided bit rate of the data input signal is slightly different from the reference frequency. The PLL allows both the phase detector 114 and the frequency detector 128 to act simultaneously to adjust the VCO control voltage by having both provide compatible charge pump control current outputs. Because the phase control must act quickly to control phase, the charge pump 120 supplies the primary control voltage Vcp directly to the VCO 118 and can cause rapid but limited amplitude variations in that voltage through the resistance provided by the FET 324 of the filter 124. Because the frequency control needs only to keep the average divided VCO frequency from varying excessively relative to the reference frequency, the voltage Vf is supplied by the charge pump 130 through the capacitor 322 of the filter 124. The capacitor 322 prevents the charge pump from immediately affecting phase but which over a period of time sums the charges from this charge pump current as well as those from the phase control charge pump current. Furthermore, the influence of the frequency detector 128 will normally be small because the data input signal will normally have a divided bit rate very close to the reference frequency. At the same time, improper data without an inconsistent bit rate, or with a divided bit rate substantially different from the reference frequency will result in very little tendency to change the average VCO frequency, because such data will have transitions with substantially random phase positions relative to the VCO output over a period of time, hence the transitions which act to advance the VCO phase and to charge the capacitor 232 will be largely balanced by the transitions which act to retard the VCO phase and to discharge the capacitor 322.

When the phase detector 114 determines that an acceptable degree of phase lock has existed for a period of time sufficient for high probability of proper phase lock, there is no longer any need for the frequency detector 128 to continue to operate. Furthermore, the VCO divider 230 as well as the counters in the frequency detector 128 may consume a substantial amount of power, and the frequency detector 128 may occasionally generate charge pump pulses which will be of no benefit when the PLL is phase locked and may slightly increase unwanted jitter in the recovered clock signal. Therefore, the frequency detector 128 is disabled once phase lock has been firmly established by using the phase lock output from the phase detector 114 to reset all FFs, all counters and the divider of the VCO divider 230. Other more efficient means of verifying continuing proper bit rate and clock rate may be employed outside the PLL if there is sufficient likelihood of the data rate gradually changing to an unacceptable value.

Although a particular embodiment of the present invention has been described in detail, it should be appreciated that numerous variations, modifications, and adaptations may be made without departing from the scope of the present invention as defined in the claims. Frequencies and a divider ratio may be varied depending upon the implementation of the invention. The invention may be implemented into clock and data recovery circuits.

What is claimed is:

1. A phase-locked loop (PLL) for providing a frequency controlled signal which is phase-locked with an input signal, the PLL comprising:
   a voltage controlled oscillator (VCO) for generating the frequency controlled signal and first and second VCO signals, in response to a VCO control signal fed thereto, the phase of the first VCO signal relating to the frequency controlled signal, the frequency of the second VCO signal relating to the frequency controlled signal;
   phase detection means for providing a first detection signal in response to the input signal and the first VCO signal, the first detection signal representing the phase difference between the input signal and the first VCO signal;
   frequency detection means for providing a second detection signal in response to a frequency reference signal and the second VCO signal, the second detection signal representing the frequency difference between the frequency reference signal and the second VCO signal;
   charge pump circuitry including first and second charge pumps, the first charge pump generating a first charge pump current in response to the first detection signal, the second charge pump generating a second charge pump current in response to the second detection signal; and
   current integrating means for integrating the first and second charge pump currents to provide the VCO control signal fed to the VCO, so that the frequency of the frequency controlled signal is controlled by the VCO and the frequency controlled signal is phase-locked with the input signal.

2. The PLL of claim 1, wherein the current integrating means comprises filter means including capacitive and resistive elements, the capacitive element integrating the first and second charge pump currents to provide the VCO control signal, the resistive element limiting the amplitude modulation of the VCO control signal.

3. The PLL of claim 1, wherein the phase detection means comprises means for providing a phase lock indication signal when the frequency controlled signal is phase-locked with the input signal, the phase lock indication signal causing the frequency detection means to be disabled.

4. The PLL of claim 1, wherein the frequency detection means comprises frequency comparison means for determining when the frequency of the second VCO signal is different from that of the frequency reference signal.

5. The PLL of claim 4, wherein the frequency comparison means comprises first and second frequency count means, the first frequency count means counting the frequency of the frequency reference signal, the second frequency count means counting the frequency of the second VCO signal.

6. The PLL of claim 5, wherein the frequency comparison means further comprises decision means for determining whether the frequency of the second VCO signal is different from the frequency of the frequency reference signal, in response to the count results of the first and second count means.

7. The PLL of claim 6, wherein the decision means comprises logic circuits for inhibiting frequency counting of the first frequency count means when the frequency of the second VCO signal is higher than the frequency of the frequency reference signal and for inhibiting frequency counting of the second frequency count means when the frequency of the second VCO signal is lower than the frequency of the frequency reference signal.

8. The PLL of claim 6, wherein the frequency comparison means further comprises detection output means for providing charge pump control signals, in response to the determination by the decision means, the charge pump control signals causing current to be produced in proportion to the difference in the frequencies counted by the first and second frequency count means, the produced current varying the VCO control signal.

9. The PLL of claim 5, wherein the first frequency count means comprises a first counter and the second frequency count means comprises a frequency divider and a second counter, the first counter counting the frequency of the frequency reference signal, the frequency divider dividing the frequency of the second VCO signal to provide a divided VCO frequency, the second counter counting the divided VCO frequency.

10. The PLL of claim 8, wherein the detection output means comprises first and second output means for providing first and second output signals for controlling the charge pump, the first and second output signals being generated when the frequency of the divided is higher and lower than that of the frequency reference signal, respectively.

11. The PLL of claim 9, wherein each of the first and second frequency counters comprises a binary counter.

* * * * *